US008835866B2

(12) United States Patent
McGinn (10) Patent No.: US 8,835,866 B2
(45) Date of Patent: Sep. 16, 2014

(54) METHOD AND STRUCTURE FOR CONTROLLING MAGNETIC FIELD DISTRIBUTIONS IN AN EXB WIEN FILTER

(75) Inventor: James B. McGinn, Portland, OR (US)

(73) Assignee: FEI Company, Hillsboro, OR (US)

(*) Notice: Subject to any disclaimer, the term of this patent is extended or adjusted under 35 U.S.C. 154(b) by 44 days.

(21) Appl. No.: 13/111,634

(22) Filed: May 19, 2011

(65) Prior Publication Data
US 2012/0292497 A1 Nov. 22, 2012

(51) Int. Cl.
*H01J 1/50* (2006.01)
*H01J 37/05* (2006.01)
*H01J 49/28* (2006.01)
*H01J 37/15* (2006.01)

(52) U.S. Cl.
CPC ........... *H01J 37/05* (2013.01); *H01J 2237/057* (2013.01); *H01J 49/288* (2013.01); *H01J 37/15* (2013.01); *H01J 2237/31749* (2013.01)
USPC .................................................. 250/396 ML

(58) Field of Classification Search
USPC ...... 250/396 R, 396 ML, 305, 304, 306, 307, 250/492.1, 491.1, 492.3, 505.1
See application file for complete search history.

(56) References Cited

U.S. PATENT DOCUMENTS

| 3,723,733 | A | * | 3/1973 | Seliger et al. ................. 250/298 |
| 3,974,687 | A | * | 8/1976 | Asmus et al. .................... 73/126 |
| 3,984,687 | A | * | 10/1976 | Loeffler et al. ........ 250/396 ML |
| 4,019,989 | A | * | 4/1977 | Hazewindus et al. .. 250/396 ML |
| 4,697,086 | A | | 9/1987 | Ishitani et al. |
| 4,755,685 | A | | 7/1988 | Kawanami et al. |
| 4,789,787 | A | * | 12/1988 | Parker .................... 250/396 ML |
| 4,929,839 | A | | 5/1990 | Parker et al. |
| 4,959,544 | A | | 9/1990 | Sukenobu |

(Continued)

FOREIGN PATENT DOCUMENTS

| FR | 2723664 | 9/1994 |
| JP | 55-166907 | 12/1980 |
| JP | 01-155252 | 6/1989 |
| JP | 2006-278069 | 10/2006 |

OTHER PUBLICATIONS

M. J. Merchant, The Use of the Wien Filter to Eliminate Object SLit Scattering in MeV Ion Nanobeam Systems, Mar. 13, 2009, Nuclear Instruments and Methods in Physcis Research B, pp. 2021-2023.*

(Continued)

*Primary Examiner* — Michael Logie
*Assistant Examiner* — Jason McCormack
(74) *Attorney, Agent, or Firm* — Scheinberg & Associates, PC; Michael O. Scheinberg; Ki O (57) ABSTRACT

An ExB Wien mass filter providing a method and structure for mechanically adjusting the magnetic field distributions at the mass filter entrance and exit end caps. The reluctance of the flux return path may be modified by configuring pluralities of magnetic shims within slots at the outer diameters of the entrance and exit end caps, and also by configuring pluralities of magnetic plug shims within circular flux dams surrounding the entrance and exit apertures. Advantages of purely mechanical adjustment for the magnetic fields of the present invention, compared with prior art electromagnet adjustment methods include greater reliability, simplicity, lower cost, and lack of power dissipation. The invention may employ either permanent magnets or electromagnets for generation of the mass-separation magnetic field.

19 Claims, 10 Drawing Sheets

(56) References Cited

U.S. PATENT DOCUMENTS

| | | | |
|---|---|---|---|
| 5,365,064 | A | 11/1994 | Rettinghaus |
| 6,593,578 | B1 * | 7/2003 | Duval et al. ............ 250/396 ML |
| 7,501,644 | B2 | 3/2009 | Zani et al. |
| 7,507,956 | B2 | 3/2009 | Frosien et al. |
| 2002/0104966 | A1 | 8/2002 | Plies et al. |
| 2003/0030008 | A1 * | 2/2003 | Sobukawa et al. ........ 250/396 R |
| 2006/0197037 | A1 * | 9/2006 | Purser et al. ............. 250/492.21 |
| 2008/0067396 | A1 * | 3/2008 | Ohshima et al. ....... 250/396 ML |
| 2009/0159810 | A1 * | 6/2009 | Knippelmeyer et al. ..................... 250/396 ML |

OTHER PUBLICATIONS

Teichert, J., et al., "Achromatic two-stage E X B mass filter for a focused ion beam column with collimated beam", Meas. Sci. and Technol., 1993, pp. 754-763, vol. 4.

Couder, M. et al., "Design of the recoil mass separator St. George," Nuclear Instruments & Methdos in Physics Research, Section A, 2008, pp. 35-45, vol. 587.

Extended European Search Report for Application No. 12167972.4 dated Jul. 30, 2013.

* cited by examiner

FIG. 8 Section C-C

Section D-D

METHOD AND STRUCTURE FOR CONTROLLING MAGNETIC FIELD DISTRIBUTIONS IN AN EXB WIEN FILTER

TECHNICAL FIELD OF THE INVENTION

The present invention relates to charged particle beam systems, and in particular, to a mass filter for an ion beam system.

BACKGROUND OF THE INVENTION

Some focused ion beam (FIB) columns are intended for use with ion sources that emit multiple ion species. In order to select only one of these ion species for the beam to be focused onto a substrate, the FIB column will typically include a mass filter. One type of mass filter, a "Wien filter," uses crossed electric and magnetic fields (ExB) to deflect unwanted ion species off-axis, thereby causing them to strike a mass-separation aperture. This type of filter is also referred to as an "ExB filter." The relative strengths of the electric and magnetic fields are set so that the desired ion species will pass through the mass filter undeflected, then through the mass-separation aperture, and will finally be focused on the substrate surface.

Ions pass through the Wien filter within a "physical aperture," that is, the area enclosed by the electric and magnetic pole faces. Ideally, the magnitudes of the magnetic field and the electric field would have the same ratio along the entire beam axis passing through the mass filter. In general, in the prior art, various electrode and pole piece configurations have been employed to achieve this field-matching goal, but maintaining the proper field ratio has been problematic near the end caps which terminate both the electric- and magnetic-fields at the entrance and exit to the mass filters. Typically, the end caps have small apertures through which the ion beams enter and exit the mass filter. Smoothly terminating the electric field without either E-field reversals or extra E-field peaks within the apertures is relatively easy with any reasonable electrical conductivity for the end cap metal. Conversely, since magnetic materials have permeabilities which are proportionately much lower than electrical conductivities (compared with air or vacuum), it has been found to be much harder to terminate the B-fields without negative overshoots or extra B-field peaks within the apertures.

What is needed is an improved method and apparatus allowing the adjustment of the B-field distributions within and near to the entrance and exit apertures of an ExB mass filter to obtain better matching between the E-field and B-field distributions over the entire axial length of the mass filter, including through the entrance and exit apertures. It would desirable for such an adjustment of the B-field to the E-field to be effected purely mechanically, without the need for electromagnet power supplies and electromagnetic coils added to the ExB mass filter for B-field adjustment.

SUMMARY OF THE INVENTION

It is an object of the invention, therefore, to provide an improved ExB Wien mass filter for use with a focused ion beam system. An ExB filter in accordance with preferred embodiments of the invention provides a structure and method for mechanically adjusting the magnetic field distribution and the entrance and exit apertures to achieve better matching between the electric and magnetic fields thereby equalizing the opposing electric and magnetic forces throughout the length of the ExB filter, including near the end caps and within the entrance and exit apertures. A further object of the invention is to enable a reduction in the lengths of ExB mass filters designed in accordance with preferred embodiments of the invention by allowing closer internal spacings between the end caps and pole pieces.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Preferred embodiments of the invention provide a method and structure for mechanically adjusting the magnetic field distribution and the entrance and exit apertures of an ExB mass filter to achieve better matching between the electric and magnetic fields, thereby equalizing the opposing electric and magnetic forces throughout the length of the ExB filter, including between the end cap inner surfaces and the edges of the pole pieces, and within the entrance and exit apertures. Preferably, the outer edges of the entrance and exit end caps of an ExB mass filter according to the present invention are configured with thicker ring having a radial slot. Within that radial slot magnetic shims may be fitted and adjusted to enable balancing of two flux distributions within the end cap: 1) the flux corresponding to the return path around the outside of the mass filter—this flux largely consists of the flux which extends between the pole pieces and induces forces on ions passing through the mass filter, and 2) the flux corresponding to "leakage" from the edges of the pole pieces to the end caps—this flux is essentially "wasted" since it does not perform the ion beam deflection function of the mass filter. These two flux distributions generally would flow in opposite directions within the end caps near the entrance and exit apertures.

Additional mechanical adjustment of the B-field near the end caps and within the apertures is effected using magnetic plug shims within circular flux dams surrounding both the entrance and exit apertures. Preferred embodiments of the invention enable purely mechanical B-field adjustments, with no need for electromagnetic field coils or power supplies. This advantage applies even for preferred embodiments of the invention employing electromagnets to excite the magnetic pole pieces since the leakage B-fields will occur for either permanent magnet or electromagnet preferred embodiments of the invention. Advantages of purely mechanical adjustment of the B-fields near the end caps and within the apertures, compared with prior art electromagnet methods, include greater simplicity, lower cost, no power dissipation, and high B-field stability (since there are no power supply fluctuations). Real-time B-field adjustment may be effected using a Gaussmeter to probe the B-fields in the entrance and exit apertures while adjusting the numbers, locations, and compositions (i.e., permeabilities) of the magnetic shims within the end cap radial slots and also the numbers, locations, and compositions (i.e., permeabilities) of the magnetic plug shims within the flux dams surrounding the entrance and exit apertures. "B-field adjustment" comprises both the reduction of the magnetic field magnitude, preferably to values below one percent of the peak magnitude, as well as changing the direction of the magnetic field. The use of the magnetic shims, as described below can be used to change the direction (+or −). The use of the magnetic plug shims, however, can change the magnetic field direction within and near to the entrance and exit apertures to any angle. This can be significant because Applicants have determined experimentally that the magnetic field is sometimes shifted in various directions, probably due to inhomogeneities in the mass filter component materials.

Embodiments of the invention thus provide one or more advantages over typical prior art mass filters and focused ion beam systems. Not all embodiments will provide all the benefits. Some embodiments of the invention provide an ExB mass filter that can separate ion species in the beam based on the species' charge/mass ratio. Some embodiments of the present invention can provide a mechanically-variable magnetic field distribution. Some embodiments of the invention provide mechanically-variable magnetic fields within the entrance and exit apertures. Some embodiments of the invention provide for mechanical control of the magnitude of the magnetic field within and near the entrance and exit apertures.

In order to more fully explain the method and structure of the present invention, prior art ExB Wien filters will now be described in greater detail. In the design of ExB Wien filters, there are two criteria for proper ExB mass separation:
1) The E- and B-fields should be perpendicular,
2) The E- and B-fields should have the same strength ratio, B/E, at all points in order for the cancellation of the electric force by the magnetic force to apply to the same charge-to-mass ratio ions.

For maximized transmission of ions through the mass filter with proper mass filtering (i.e., force cancellation for the same charge-to-mass ratio everywhere) it is desirable to meet these two criteria over the largest possible aperture over as much of the axial length of the mass filter as possible—ideally from the entrance aperture all the way through the filter to the exit aperture. To the extent that these two criteria are not met for some portions of the ion beam trajectories through the mass filter, there will be increased optical aberrations and beam misalignments, both contributing to reduced performance of the mass filter and consequently to the focused ion beam system comprising the mass filter.

Figure 1:
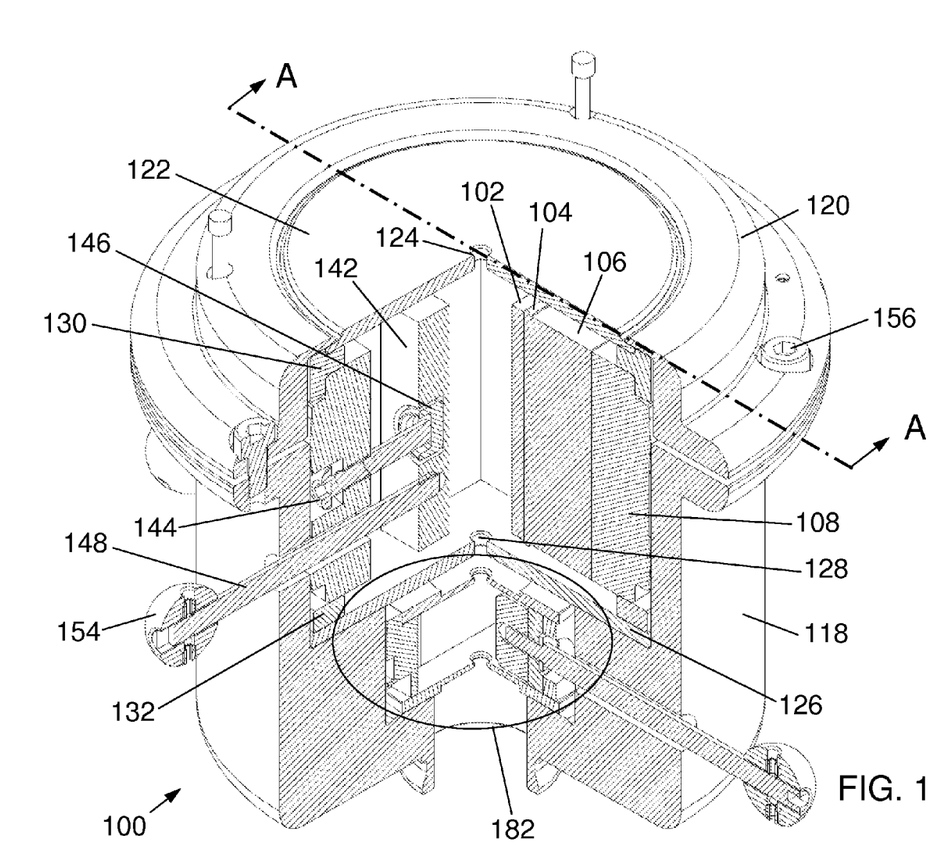
FIG. 1 is an isometric quarter-cutaway view of a prior art ExB mass filter.
Figure 2:
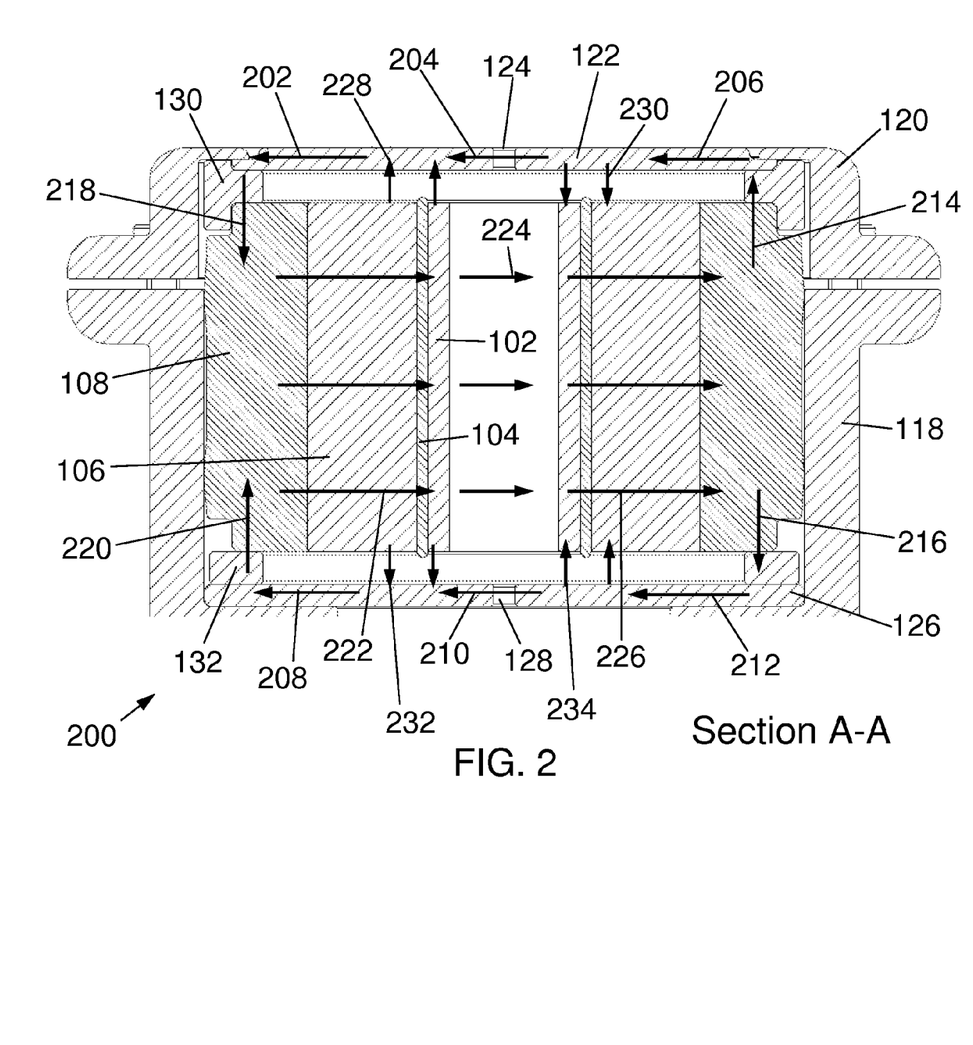
FIG. 2 is a side cross-section illustrating the magnetic circuit of a prior art ExB mass filter.

FIG. 1 is an isometric quarter-cutaway view of a prior art ExB mass filter 100. Section A-A is illustrated in FIG. 2. A magnetic pole piece 102 is attached to a ceramic insulator 104, which is attached to magnet 106, such as a neodymium-iron-boron (NdFeB) or samarium-cobalt (SmCo) alloy magnet, or other similar high strength permanent magnet. In alternative embodiments, electromagnet coils may be substituted for the permanent magnets 106 shown here. Magnets 106 (typically in a pair—only one is visible in the cutaway view 100) are attached to yoke 108, typically comprised of a relatively high saturation magnetic material, such as nickel-iron (e.g., NiFe43 or NiFe48).

In FIG. 1, the ion beam to be mass-separated would enter mass filter 100 through aperture 124 in entrance end cap 122. The various mass-separated ion beams would exit mass filter 100 through exit aperture 128 in exit end cap 126. In general, the angular deflection of the non-selected ion species (i.e., those species not wanted in the ion beam to be focused on a sample) will be deflected along the E-field axis—from the lower left to the upper right of FIG. 1. In the majority of cases, this deflection will be small enough that these non-selected ion beams will pass through exit aperture 128, to be blocked by a mass separation aperture (not shown) below the ExB mass filter. The selected ion beam will pass approximately through the center of exit aperture 128 and then through the mass separation aperture to be focused on the specimen. The magnetic field which performs the mass-separation of the ion beams is generated between the inner faces of the two pole pieces 102. These "gap fields" 224 are illustrated in FIG. 2.

Perpendicular to the B-field 224, an electric field is established between a pair of electrodes 142 which in the embodiment shown are pressed inwards by mounting screws 144 (threaded into yoke 108) that push against insulators 146. Electrical connections to electrodes 142 are effected through rods 148 extending radially outwards through clearance holes in the yoke 108 and housing 118, and having corona-prevention balls 154 at the outer ends. The electrode and pole piece configuration shown here corresponds to that shown in U.S. Pat. No. 4,789,787 issued Dec. 6, 1988 (see FIGS. 4A and 4B therein), which is incorporated by reference.

Entrance spacer 130 and exit spacer 132 separate end caps 122 and 126, respectively, from yoke 108. The choice of material for spacer 130 determines the degree of magnetic coupling (reluctances 432 and 434 in FIG. 4) between the flux flowing radially (generally perpendicular to the ion beams) within the entrance end cap 122 and the flux flowing axially (generally parallel to the ion beams) within the yoke 108. Similarly, the choice of material for spacer 132 determines the degree of magnetic coupling (reluctances 482 and 484 in FIG. 4) between the flux flowing radially within the exit end cap 132 and the flux flowing axially within the yoke 108. Spacers 130 and 132 may be fabricated of a non-magnetic material, such as aluminum or 300-series stainless steel to reduce the magnetic coupling (i.e., larger values for reluctances 432, 434, 482, and 484 in FIG. 4). Spacers 130 and 132 may be fabricated of a magnetic material, such as NiFe43, NiFe48, or 400-series stainless steel to increase the magnetic coupling (i.e., smaller values for reluctances 432, 434, 482, and 484).

Generally in ExB mass filters 100 such as that shown in FIG. 1, it is difficult or impossible to achieve precisely the desired level of magnetic coupling due to the limited number of material choices for spacers 130 and 132. An object of the present invention is to provide a means for a mechanically-variable adjustment for the magnetic coupling between end caps 122 and 126 to the yoke 108 to achieve approximately the desired level of magnetic coupling (see adjustable reluctances 1032, 1034, 1082, 1084, 1010, and 1060 in FIG. 10).

A housing 118 encloses the yoke 108, with a clamping ring 120 (held down by screws 156) that compresses together end caps 122 and 126, spacers 130 and 132, and yoke 108. Below the ExB mass filter is an X-Y beam deflector 182 used for correction of beam deflection errors arising from the ExB mass filter 100.

FIG. 2 is a side cross-section A-A 200 illustrating the magnetic circuit of a prior art ExB mass filter. Arrows 202-234 illustrate the magnetic flux distribution within gaps, magnetic materials, and magnets. B-field 224 is "seen" by the ion beams passing through the ExB mass filter and generates the magnetic force on the ions which is generally opposite in direction and similar or identical in magnitude to the force induced by the E-field between the two electrodes 142 (as shown in FIG. 1). Fluxes 222 and 226 are between the pole pieces 102 and the yoke 108, passing through the magnets 106 and insulators 104. Within the entrance end cap 122, fluxes 202 and 206 always flow to the left, corresponding to the direction of both the return flux flowing around the outside of the magnetic circuit, as well as connecting the leakage fluxes 228 and 230 to the outer ends of the magnets 106. Similarly, within exit end cap 126, fluxes 208 and 212 also always flow to the left, corresponding to the direction of both the return flux flowing around the outside of the magnetic circuit, as well as connecting leakage fluxes 232 and 234 to the outer ends of magnets 106. Fluxes 214 and 218 connect between the entrance end cap 122 and the yoke 108, passing through spacer 130. Fluxes 216 and 220 connect between the exit end cap 126 and the yoke 108, passing through spacer 132.

Since the entrance end cap 122 has good electrical conductivity, the E-field tends to be terminated fairly abruptly and generally with essentially no E-field within aperture 124. Since for correct ExB operation the B-field strength should be proportional to the E-field (with the same ratio everywhere on-axis), the B-field should drop off to approximately zero strength within aperture 124, as well. Similar considerations apply to flux 210 inside aperture 128 in end cap 126.

In FIG. 2, however, the B-fields inside the entrance aperture 124 show flux 204 pointing to the left. This means that the amount of return flux 202 and 206 from magnets 106 exceeds the leakage fluxes 228 and 230 (which would go to the right within end cap 122). Thus there is a B-field reversal between the gap field 224 and flux 204 (see dip 510 in FIG. 5). If flux 204 were pointing to the right, this would mean that the amount of return flux 202 and 206 from magnets 106 is less than the leakage fluxes 228 and 230. In that case, there would be no flux reversal between the gap field 224 and flux 204 (see peak 610 in FIG. 6). The function of the entrance end cap 122, however, is to terminate both the B-field and the E-field, ideally with approximately the same rate of decrease as a function of distance along the axis of the ExB mass filter, thereby preserving the correct B/E ratio.

In some circumstances, with different choices of material with which to fabricate spacers 130 and 132, it may be possible to control the directions of fluxes 204 and 210, but it is generally difficult to exactly match the return fluxes and gap fluxes in order to nearly cancel out fluxes 204 and 210. Another option for adjusting the directions and magnitudes of fluxes 204 and 210 could be the choice of material with which to fabricate the end caps 122 and 126. Examples of suitable materials with moderate permeabilities include 400-series stainless steel, such as alloy SS430. These solutions, however, are much more limited and inflexible than embodiments of the present invention described below.

Figure 3A:
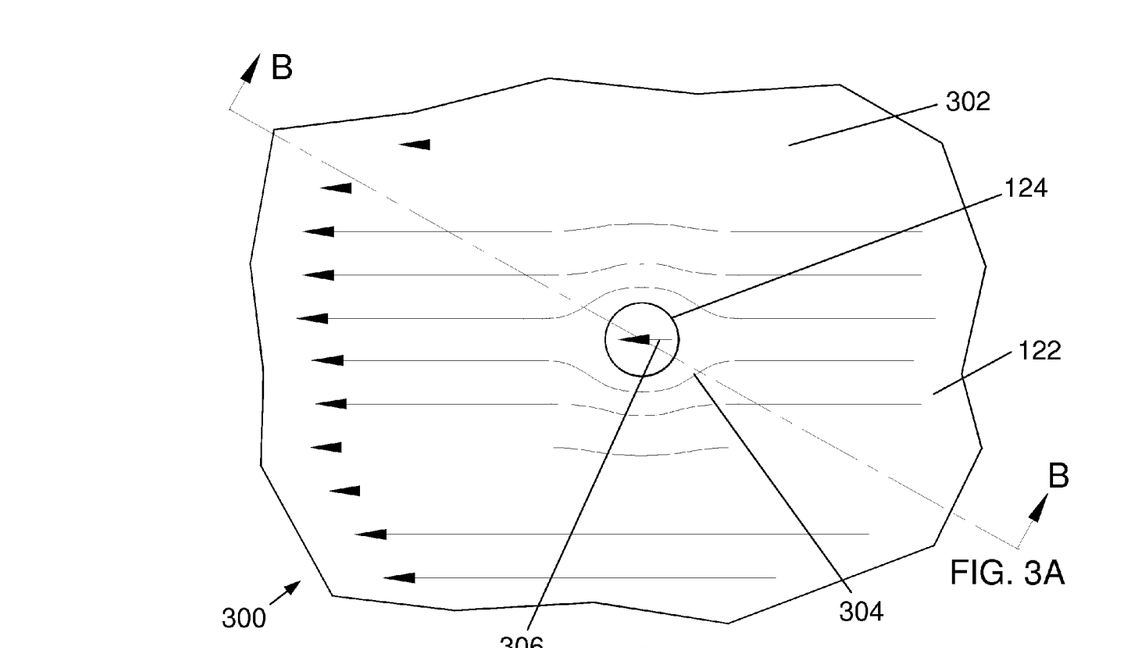
FIG. 3A is a schematic plan view of an entrance end cap of a prior art ExB mass filter.
Figure 3B:
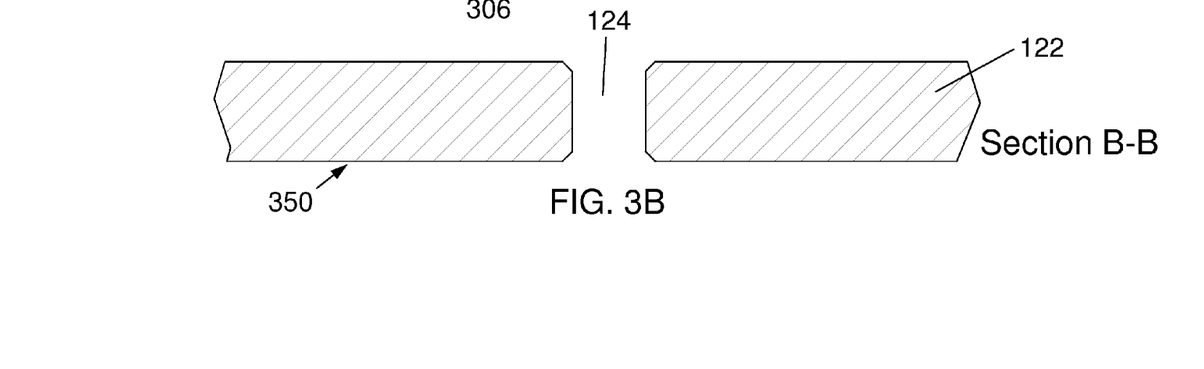
FIG. 3B is a schematic side cross-section of an entrance end cap of a prior art ExB mass filter.

FIG. 3A is a schematic plan view 300 of entrance end cap 122 with aperture 124 of the prior art ExB mass filter 100 of FIGS. 1 and 2. The magnetic flux distribution within entrance end cap 122 and across aperture 124 is illustrated by arrows 302, 304 and 306. Aperture 124 perturbs what would normally be a uniform right-to-left flux distribution within end cap 122; however flux lines 302 are far enough from aperture 124 to exhibit minimal perturbation. Flux lines 304 closest to aperture 124 have the largest perturbation—wrapping around aperture 124 as shown. Across aperture 124, flux 306 has a generally uniform distribution with a magnitude determined by the balance between return fluxes 202 and 206 flowing from magnets 106 and the leakage fluxes 228 and 230 from the edges of pole pieces 102, as discussed above. FIG. 3B is a schematic side cross-section B-B 350 of entrance end cap 122 with aperture 124 of a prior art ExB. The flux 306 within aperture 124 illustrates that the B-field in the prior art mass filter 100 is not properly terminated by the end cap 122.

Figure 4:
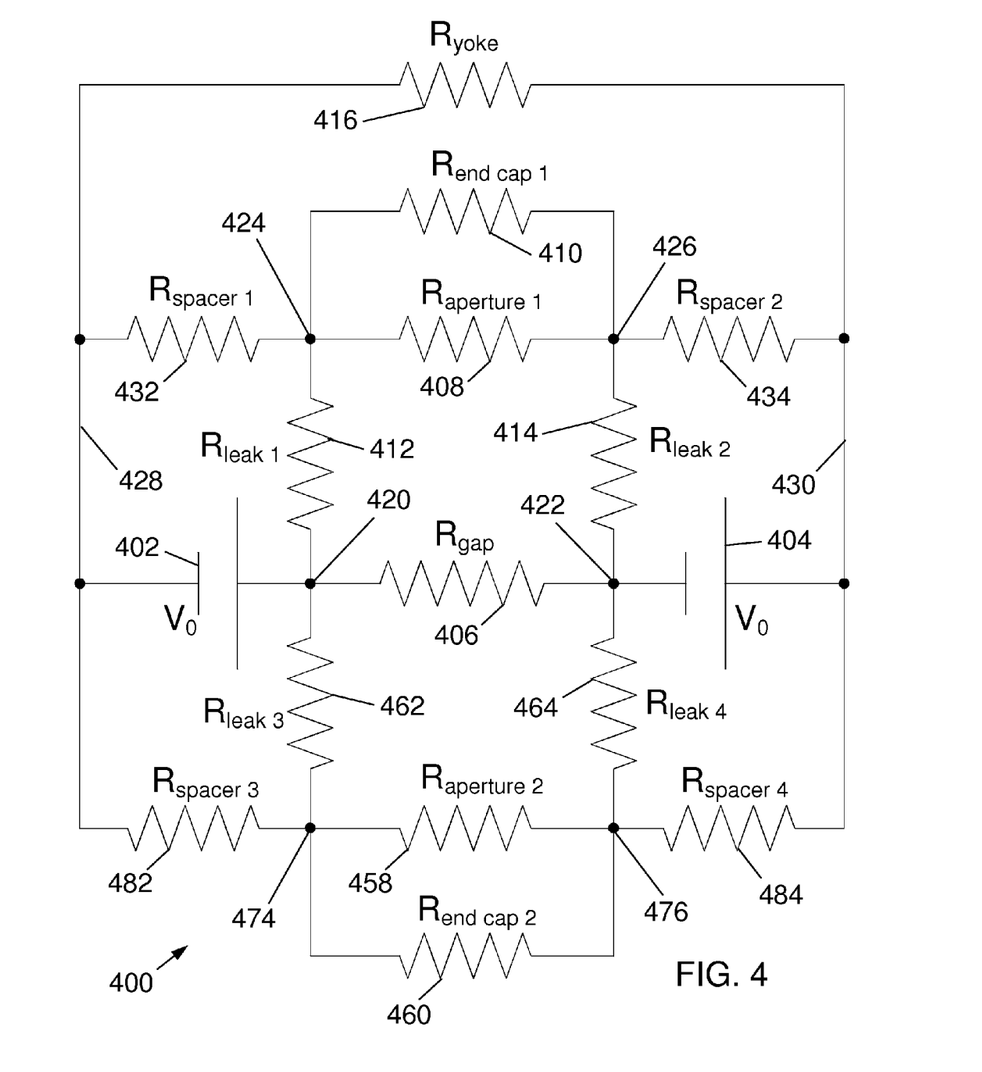
FIG. 4 is an electrical circuit analog to the magnetic circuit illustrated in FIG. 2.

FIG. 4 is an electrical circuit 400 analog to the magnetic circuit illustrated in FIG. 2. In this schematic diagram, the resistors are labeled with their respective correspondences to the reluctances of various elements of the ExB mass filter in FIGS. 1 and 2. Batteries 402 and 404 have voltages $V_0$ representing the remanence of the two magnets 106. $R_{gap}$ 406 represents the reluctance of the gap between pole pieces 102, corresponding to the physical aperture of the ExB through which the ions pass. $R_{yoke}$ 416 represents the reluctance of the yoke 108 which conveys the majority of the flux induced by magnets 106 from the right side of the right magnet 106 around to the left side of the left magnet 106 in FIG. 2. $R_{spacer\ 1}$ 432 and $R_{spacer\ 2}$ 434 correspond to the reluctances across spacer 130 at the left and right edges of entrance end cap 122 in FIG. 2, respectively. Similarly, $R_{spacer\ 3}$ 482 and $R_{spacer\ 4}$ 484 correspond to the reluctances across spacer 132 at the left and right edges of exit end cap 126 in FIG. 2, respectively. $R_{aperture\ 1}$ 408 and $R_{end\ cap\ 1}$ 410 are in parallel, representing the reluctances across entrance aperture 124 and around aperture 124 (within entrance end cap 122), respectively. $R_{aperture\ 2}$ 458 and $R_{end\ cap\ 2}$ 460 are in parallel, representing the reluctances across exit aperture 128 and around aperture 128 (within exit end cap 126), respectively. Finally, the four resistors $R_{leak\ 1}$ 412, $R_{leak\ 2}$ 414, $R_{leak\ 3}$ 462, and $R_{leak\ 4}$ 464 represent the reluctances between the edges of the pole pieces 102 and the inner surfaces of the two end caps 122 and 126.

Eight voltage nodes 420, 422, 424, 426, 428, 430, 474, and 476 are illustrated in FIG. 4, where, for example, the voltage at a node 420 is notated $V_{420}$, etc. The currents are notated similarly, for example the current through resistor $R_{gap}$ 406 is $I_{406}$, etc. In an ExB mass filter for which the choice of material in the spacers 130 and 132 is to be made (in order to reduce the B-field within the apertures 124 and 128 to as small a percentage as possible of the maximum B-field in the gap between pole pieces 102), all the reluctances except for $R_{spacer\,1}$ 432, $R_{spacer\,2}$ 434, $R_{spacer\,3}$ 482 and $R_{spacer\,4}$ 484 are pre-determined by the design of the ExB mass filter. Also, the strengths of the magnets 106, $V_0$, are pre-determined by the choice of magnet material (e.g., neodymium-iron-boron, samarium-cobalt, or alnico). For simplicity in the following analysis, the following assumptions and definitions are made:

$$R_{end\,cap\,1} = R_{end\,cap\,2} \equiv R_{end\,cap}, \quad [eq.\,1]$$

$$R_{aperture\,1} = R_{aperture\,2} \equiv R_{aperture}, \quad [eq.\,2]$$

$$R_{spacer\,1} = R_{spacer\,2} = R_{spacer\,3} = R_{spacer\,4} \equiv R_{spacer}, \quad [eq.\,3]$$

$$R_{leak\,1} = R_{leak\,2} = R_{leak\,3} = R_{leak\,4} \equiv R_{leak}. \quad [eq.\,4]$$

By symmetry, the following assumptions can also be made:

$$V_{420} = -V_{422} = (I_{406} R_{gap})/2 \equiv V_A, \quad [eq.\,5]$$

$$V_{426} = -V_{476} = -V_{424} = -V_{474} = (I_{408} R_{aperture})/2 = (I_{410} R_{end\,cap})/2 \equiv V_B, \quad [eq.\,6]$$

$$V_{430} = -V_{428} = (I_{416} R_{yoke})/2 \equiv V_C, \quad [eq.\,7]$$

$$V_{430} - V_{426} = V_C - V_B = I_{434} R_{spacer}, \quad [eq.\,8]$$

$$V_{426} - V_{422} = V_B - (-V_A) = V_B + V_A = I_{414} R_{leak}. \quad [eq.\,9]$$

To reduce the B-fields in apertures 124 and 128 to as small a percentage as possible of the maximum B-field in the gap between pole pieces 102, currents $I_{408}$ and $I_{458}$, respectively, must both be approximately zero so from circuit diagram 400 there cannot be a voltage drop across either $R_{aperture}$ or $R_{end\,cap}$ and the following equalities must hold:

$$V_B = 0, \quad [eq.\,10]$$

$$I_{408} = I_{410} = I_{458} = I_{460} = 0, \quad [eq.\,11]$$

$$I_{412} = I_{432} = I_{414} = I_{434} = I_{462} = I_{482} = I_{464} = I_{484} \equiv I_1, \quad [eq.\,12]$$

$$I_{406} = I_{416} \equiv I_2. \quad [eq.\,13]$$

Plugging $I_1$ and $I_2$ from equations 12 and 13 into equations 5 and 7 gives:

$$V_A = (I_2 R_{gap})/2, \quad [eq.\,14]$$

$$V_C = (I_2 R_{yoke})/2. \quad [eq.\,15]$$

Plugging $V_B$ from equation 10, and $I_1$ and $I_2$ from equations 12 and 13, into equations 8 and 9 gives:

$$V_A = I_1 R_{leak}, \quad [eq.\,16]$$

$$V_C = I_1 R_{spacer}. \quad [eq.\,17]$$

Setting the ratio of equations 14 and 15 equal to the ratio of equations 16 and 17 gives:

$$V_A/V_C = R_{gap}/R_{yoke} = R_{leak}/R_{spacer}. \quad [eq.\,18]$$

Then solving for $R_{spacer}$ gives:

$$R_{spacer} = (R_{leak} R_{yoke})/R_{gap} \quad [eq.\,19]$$

Thus, equation 18 shows that the ratio of the gap reluctance to the yoke reluctance should equal the ratio of the leak reluctance (i.e., the reluctance between the edges of the pole piece and the end caps) to the reluctance of the spacers. The choice of materials and designs for the spacers 130 and 132 and the end caps 122 and 126 should be made to satisfy equation 19 as closely as possible, however in the prior art, satisfying equation 19 has not been generally achieved due to the limited number of choices for magnetic materials with the desired magnetic properties.

In general, the following holds (for efficient use of magnets 106):

$$R_{gap} \gg R_{yoke}. \quad [eq.\,20]$$

Then from equation 18:

$$R_{leak} \gg R_{spacer}, \quad [eq.\,21]$$

where the inequality in equation 21 serves as a qualitative guide to possible spacer designs, given calculations or measurements of the reluctances of the gap, yoke, and leak inserted into equation 19. Equations 20 and 21 may serve as qualitative guides when designing the magnet yoke and spacer.

For the case of an ExB mass filter without the present invention having asymmetric entrance and exit geometries (spacer and/or end cap designs), the following equations hold:

$$R_{gap}/R_{yoke} = R_{leak\,1}/R_{spacer\,1} = R_{leak\,2}/R_{spacer\,2} = R_{leak\,3}/R_{spacer\,3} = R_{leak\,4}/R_{spacer\,4}. \quad [eq.\,22]$$

Figure 5:
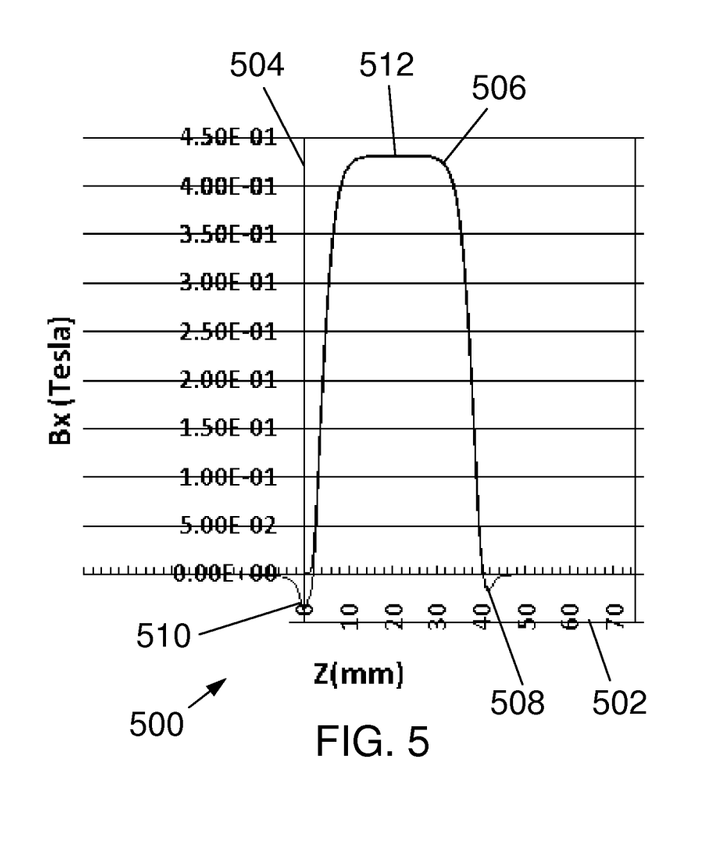
FIG. 5 is a calculated graph of the axial B-field distribution in a prior art ExB mass filter where the B-field within the entrance and exit apertures reverses direction relative to the gap field.

FIG. 5 is a calculated graph 500 of the axial B-field distribution 506 in a prior art ExB mass filter. The example in FIG. 5 corresponds to spacer reluctances which are too small, allowing the return flux from magnets 106 (flowing to the left) to exceed the leakage flux which would flow to the right in both the entrance and exit apertures. The B-field 504 in the transverse (X-axis) direction is plotted against the axial position 502 along the Z-axis (the ion beams travel in the +Z-direction). B-fields 510 and 508, corresponding to fluxes 204 and 210 in FIG. 2, respectively, reverse direction relative to the gap field 512 (flux 224 in FIG. 2). Entrance aperture 124 is at 0 mm on the Z-axis, while the center of exit aperture 128 is at about 42 mm. At entrance aperture 124, flux 204 would be going to the left as shown in FIG. 2. Negative dip 510 in the B-field at 0 mm corresponds to a field reversal within the entrance aperture 124 and illustrates poor matching between the E-field and B-field. At exit aperture 128, negative dip 508 corresponds to flux 210 going to the left as shown in FIG. 2, again illustrating poor field matching.

Figure 6:
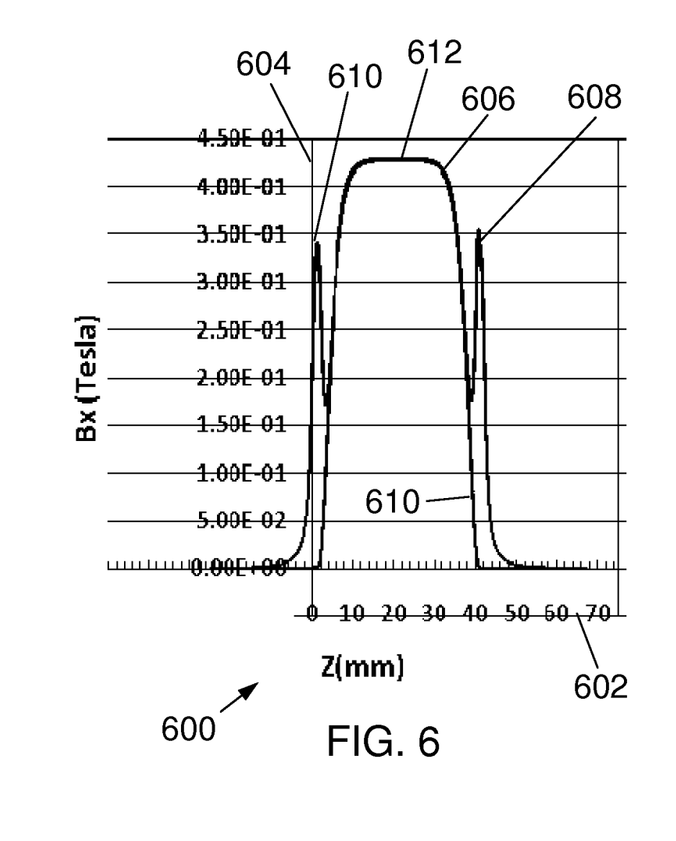
FIG. 6 is a calculated graph of the axial B-field distribution in a prior art ExB mass filter where the B-field within the entrance and exit apertures is has the same direction as the gap field.

FIG. 6 is a calculated graph 600 of the axial B-field distribution 606 in a prior art ExB mass filter. The example in FIG. 6 corresponds to spacer reluctances which are too large, allowing the leakage flux from magnets 106 (flowing to the right) to exceed the return flux which would flow to the left in both the entrance and exit apertures. The B-field 604 in the transverse (X-axis) direction is plotted against the axial position 602 along the Z-axis (the ion beams travel in the +Z-direction). B-fields 610 and 608, corresponding to fluxes 204 and 210 in FIG. 2, respectively, are increased in magnitude and have the same direction as the gap field 612 (flux 224 in FIG. 2). The entrance and exit apertures are positioned on the Z-axis as in FIG. 5. At entrance aperture 124, flux 204 would be going to the right (opposite to flux 204 shown in FIG. 2). Positive peak 610 in the B-field at 0 mm corresponds to a field concentration within the entrance aperture 124, illustrating poor matching between the E- and B-fields. At exit aperture 128, positive peak 608 corresponds to flux 210 going to the right (opposite to flux 210 shown in FIG. 2), again illustrating poor field matching. Comparison with FIG. 5 shows that the mismatch between the E- and B-fields is substantially larger for this example within both the entrance 124 and exit 128 apertures (i.e., peaks 608 and 610 have much higher B-field magnitudes than do dips 508 and 510).

The present invention, characterized in FIGS. 7-11, enables closer matching of the ratios in equation 18 described above by means of magnetic shims in the end caps and magnetic plug shims in the end rings, thereby enabling a much greater flexibility in meeting the required B/E ratio throughout the length of an ExB than is possible merely by means of materials choices for the spacers 130 and 132, or for the end caps 122 and 126.

Figure 7:
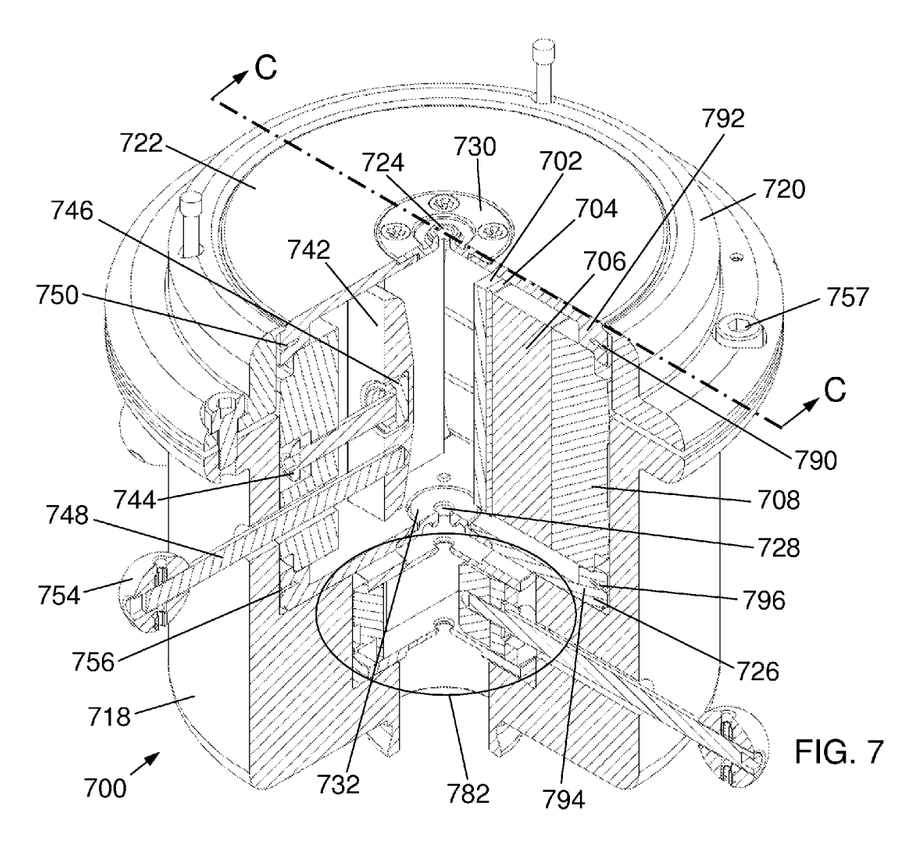
FIG. 7 is an isometric quarter-cutaway view of an ExB mass filter according to a preferred embodiment of the present invention.
Figure 8:
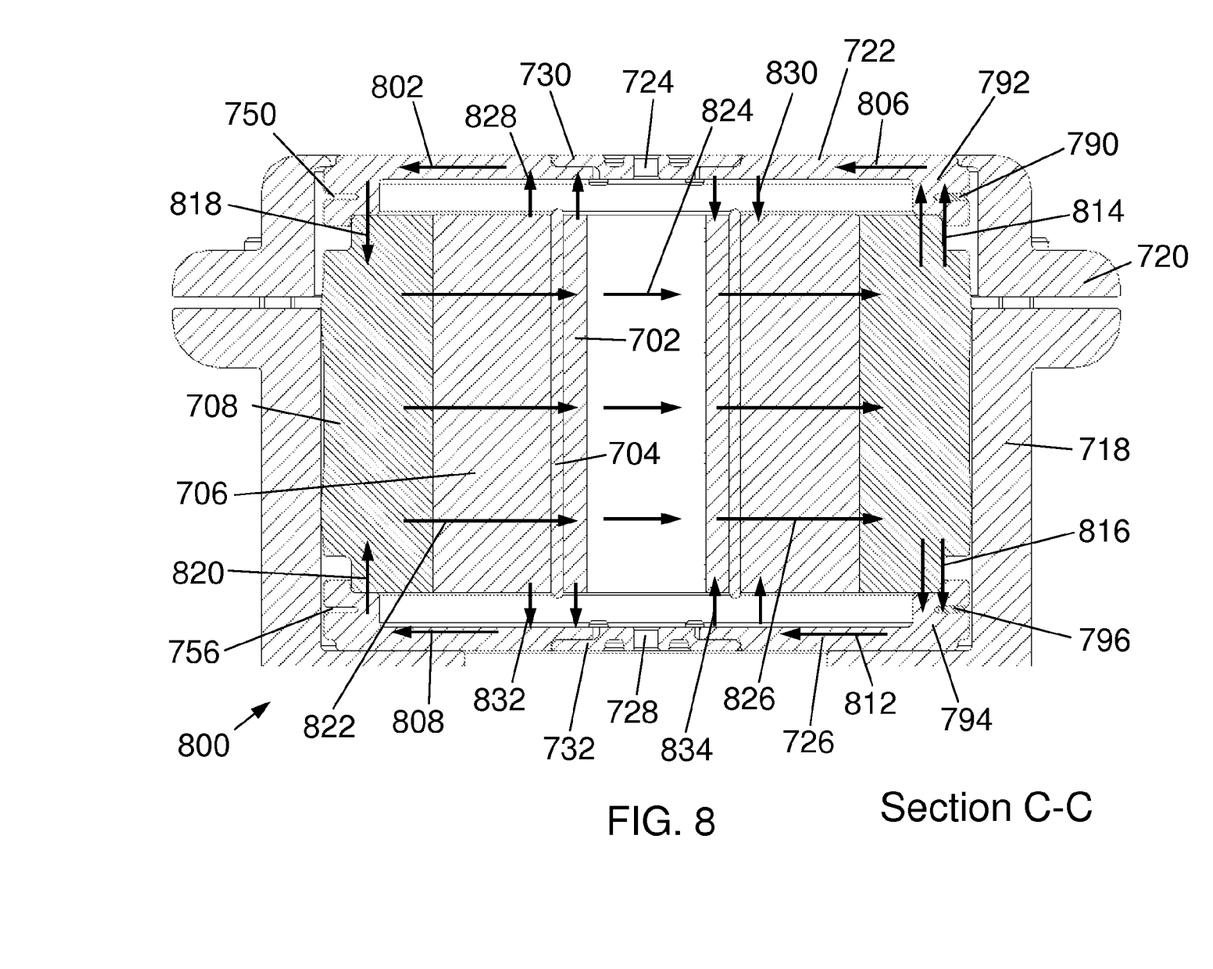
FIG. 8 is a side cross-section illustrating the magnetic circuit of an ExB mass filter according to a preferred embodiment of the present invention.

FIG. 7 is an isometric quarter-cutaway view of an ExB mass filter 700 showing a preferred embodiment of the present invention. Section C-C is illustrated in FIG. 8. A magnetic pole piece 702 is attached to a ceramic insulator 704, which is attached to magnet 706, typically a neodymium-iron-boron (NdFeB) or samarium-cobalt (SmCo) alloy magnet, or other similar high strength permanent magnet. In alternative embodiments within the scope of the invention, electromagnet coils may be substituted for the permanent magnets 706 shown here. Magnets 706 (typically in a pair—only one is visible in the cutaway view 700) are attached to yoke 708, typically comprised of a relatively high saturation magnetic material, such as nickel-iron (e.g., NiFe43 or NiFe48).

In FIG. 7, the ion beam to be mass-separated would enter mass filter 700 through aperture 724 in entrance ring 730 mounted to entrance end cap 722. The various mass-separated ion beams would exit mass filter 700 through exit aperture 728 in exit ring 732 mounted to exit end cap 726. In general, the angular deflection of the non-selected ion species (i.e., those species not wanted in the ion beam to be focused on a sample) will be deflected along the E-field axis from the lower left to the upper right of FIG. 7. This deflection in the majority of cases will be small enough that these non-selected ion beams will pass through exit aperture 728, to be blocked by a mass separation aperture (not shown) below the ExB mass filter. The selected ion beam will pass approximately through the center of exit aperture 728 and then through the mass separation aperture to be focused on the specimen. The magnetic field which performs the mass-separation of the ions beams is generated between the inner faces of the two pole pieces 702. These "gap fields" 824 are shown in FIG. 8.

Perpendicular to the B-field 824, an electric field is established between a pair of electrodes 742 which in the preferred embodiment shown are pressed inwards by mounting screws 744 (threaded into yoke 708) that push against insulators 746. Electrical connections to electrodes 742 are effected through rods 748 extending radially outwards through clearance holes in the yoke 708 and housing 718, and having corona-prevention balls 754 at the outer ends. The electrode and pole piece configuration shown corresponds to that shown in U.S. Pat. No. 4,789,787 issued Dec. 6, 1988 (see FIGS. 4A and 4B therein), which is incorporated by reference. The entrance end cap 722 has a thickened outer ring 792 which takes the place of the spacer 130 in the prior art ExB mass filter shown in FIG. 1. Outer ring 792 has a radial slot 750 which serves to increase the axial reluctance of the outer ring. Magnetic shims 790 may be inserted into slot 750 to reduce the axial reluctance of the outer ring 792. Since the number, positions, and permeabilities of shims 790 are mechanically adjustable, it is possible to vary the reluctance of the outer ring 792 over a wide range in small increments, thereby enabling a much finer adjustment of the end cap reluctance than is possible in prior art ExB mass filters, such as that shown in FIG. 1. Similar considerations apply to the radial slot 756 in exit end cap 726 having thickened outer ring 794 and magnetic shims 796.

A housing 718 encloses the yoke 708, with a clamping ring 720 (held down by screws 757) that compresses together end caps 722 and 726, and yoke 718. Below the ExB mass filter is an X-Y beam deflector 782 used for correction of beam deflection errors arising from the ExB mass filter 700. Deflector 782 is not part of the present invention.

In contrast to the prior art mass filter of FIGS. 1 and 2, the mass filter 700 according to the present invention demonstrates much closer matching of the B-field and E-field distributions. This better matching is enabled by mechanically variable reluctances 1010, 1060, 1032, 1034, 1082, and 1084 (see FIG. 10).

FIG. 8 is a side cross-section C-C 800 illustrating the magnetic circuit of an ExB mass filter showing a preferred embodiment of the present invention. Arrows 802-834 illustrate the magnetic flux distribution within gaps, magnetic materials, and magnets. B-field 824 is "seen" by the ion beams passing through the ExB mass filter and generates the magnetic force on the ions which is generally opposite in direction and similar or identical in magnitude to the force induced by the E-field between the two electrodes 742 (one shown in FIG. 7). Fluxes 822 and 826 are between the pole pieces 702 and the yoke 708, passing through the magnets 706 and insulators 704. Within the entrance end cap 722 and entrance ring 730, fluxes 802 and 806 always flow to the left, corresponding to the direction of both the return flux flowing around the outside of the magnetic circuit, as well as connecting leakage fluxes 828 and 830 to the outer ends of magnets 706. Similarly, within exit end cap 726 and exit ring 732, fluxes 808 and 812 also always flow to the left, corresponding to the direction of both the return flux flowing around the outside of the magnetic circuit, as well as connecting leakage fluxes 832 and 834 to the outer ends of magnets 706. Fluxes 814 and 818 connect between the entrance end cap 722 and the yoke 708, passing through the outer ring 792 of end cap 722 and also any magnetic shims 790 within radial slot 750. Fluxes 816 and 820 connect between the exit end cap 726 and the yoke 708, passing through the outer ring 794 of end cap 726 and also any magnetic shims 796 within radial slot 756.

Now consider the B-fields inside the entrance aperture 724 within entrance ring 730. Unlike the prior art mass filters described above, in a mass filter according to the present invention, the magnetic field orientation and magnitude within the entrance and exit apertures can be adjusted to match the electric and magnetic fields thereby equalizing the opposing electric and magnetic forces throughout the length of the ExB filter. As shown in FIG. 8, the numbers, positions and permeabilities of magnetic shims 790 have been adjusted to cancel out the B-field within entrance aperture 724, thus no flux is shown across aperture 724 (compare with flux 204 in FIG. 2). The discussion of FIGS. 9A, 9B, and 10 below describes structures and methods for achieving a B-field reduction inside entrance aperture 724.

As discussed above, the function of the entrance end cap 722 and entrance ring 730 is to terminate both the B-field and the E-field, ideally with approximately the same rate of decrease as a function of distance along the axis of the ExB mass filter, thereby preserving the correct B/E ratio. Since the entrance end cap 722 and entrance ring 730 have good electrical conductivity, the E-field tends to be terminated fairly abruptly and generally with essentially no E-field within aperture 724. For correct ExB operation, the B-field strength should be proportional to the E-field (with the same ratio everywhere on-axis), so the B-field should drop off to approximately zero strength within aperture 724, as well. Similar considerations apply to the B-field inside aperture 728 in exit ring 732 mounted to end cap 726. Unlike the prior art mass filters described above, in preferred embodiments of the present invention, the B-field within entrance and exit apertures 724, 728 can be made to drop to approximately zero strength in proportion to the E-field. Using the invention described herein, along with suitable choices of material with which to fabricate entrance end cap 722, exit end cap 726, entrance ring 730, exit ring 732, magnetic shims 790 and magnetic shims 796, it is now possible to cancel out the B-field within the entrance 724 and exit 728 apertures (see FIG. 11) to less than one percent of the maximum B-field 1112 in the gap between pole pieces 702. Exemplary suitable materials for the end caps, rings, and shims include materials with moderate permeabilities such as 400-series stainless steel, in particular alloy SS430.

The present invention thus enables a mechanical method and structure for achieving good matching of the E-fields and B-fields at the ExB entrance and exit. Better matching reduces aberrations in the ExB mass filter and also enables better beam alignment exiting from the mass filter as is familiar to those skilled in the art. The discussion of FIGS. 9A, 9B, and 10 describes structures and methods for achieving a B-field reduction inside entrance aperture 724. The same B-field reduction may be achieved within exit aperture 728.

Figures 9A, 9B:
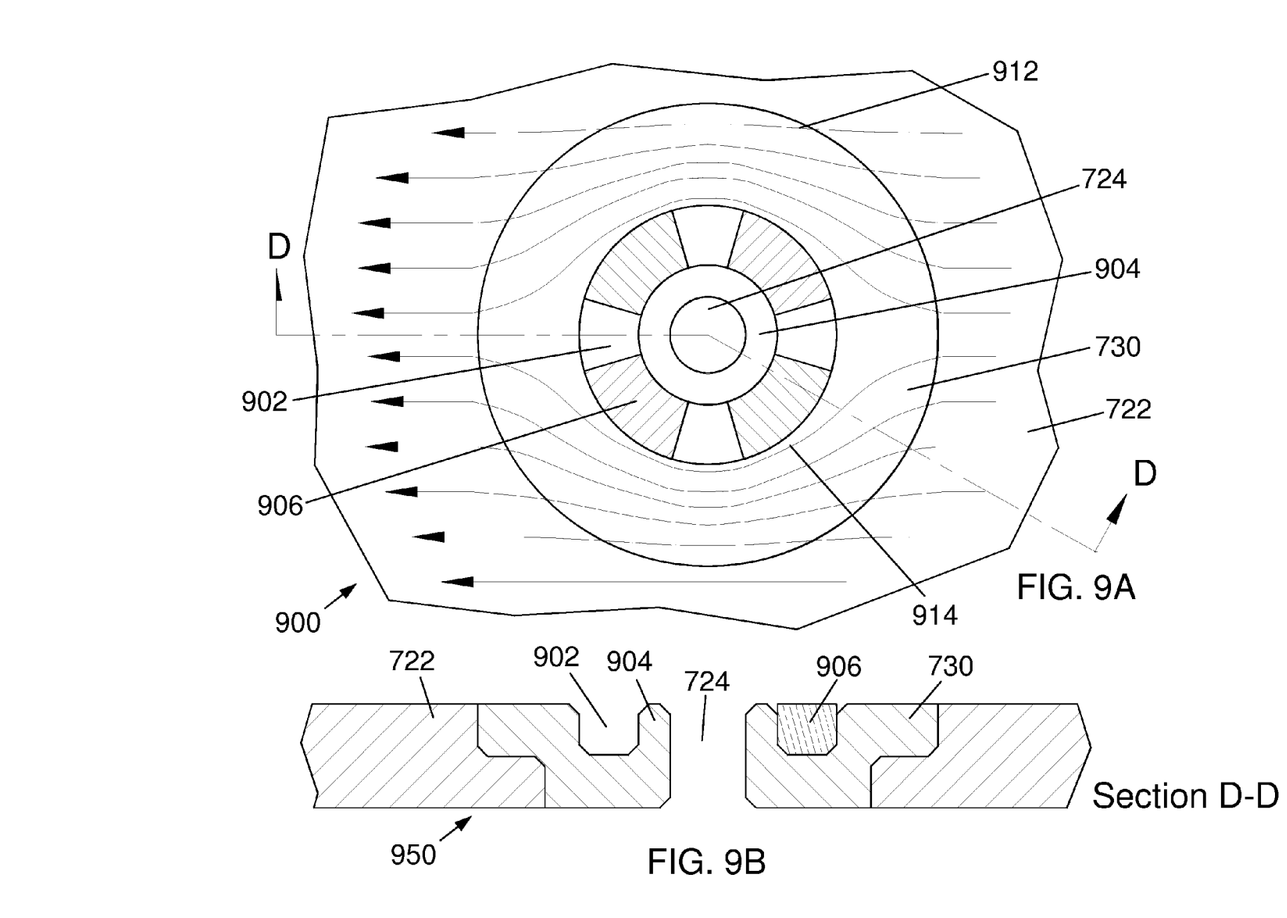
FIG. 9A is a schematic plan view of an entrance end cap of an ExB mass filter according to a preferred embodiment of the present invention.
FIG. 9B is a schematic side cross-sectional view of an entrance end cap of an ExB mass filter according to a preferred embodiment of the present invention.

FIG. 9A is a schematic plan view 900 of entrance end cap 722, entrance ring 730, and plug shims 906 of an ExB mass filter showing a preferred embodiment of the present invention. The magnetic flux distribution within entrance end cap 722 and entrance ring 730 is illustrated by the arrows 802 and 806 in FIG. 8. As discussed above, with proper choice of the numbers, shapes and materials of the entrance end cap 722, entrance ring 730, and shims 790, the magnetic field inside aperture 724 may be reduced to less than one percent of the maximum B-field in the gap between pole pieces 702. FIGS. 9A and 9B illustrate some additional elements of a preferred embodiment of the invention that enable additional control over the B-field inside aperture 724, including both the B-field magnitude and direction.

The entrance ring 730 may be comprised of a different material from the entrance end cap 722. Within entrance ring 730, as shown in FIGS. 9A and 9B, a flux dam 902 surrounds the wall 904 of aperture 724, forming a higher reluctance barrier to a portion of the flux, such as flux lines 914 which would normally pass nearer to aperture 724 (see flux line 304 in FIG. 3A, for example). Flux lines 912 are farther from the flux dam 902 and thus deviate less from a straight flow right-to-left within entrance end cap 722 and entrance ring 730. In some cases, it is possible that for optimum matching of the E-field to the B-field within and near to aperture 724, that some local deflections of the B-field may be desirable, for example to correct the B-field direction in a manufactured ExB mass filter in which the magnets 706 are magnetized asymmetrically (a common occurrence).

Magnetic plug shims 906 may be inserted into various portions of the flux dam 902 as illustrated in FIGS. 9A and 9B. The choice of materials for magnetic plug shims 906 may typically be soft magnetic materials such as 400-series stainless steel, or higher permeability magnetic materials such as nickel-iron alloys. Although plug shims 906 are shown as four arc segments, many other shapes fall within the scope of the invention, including thin rings, arcs with larger enclosed angles, arcs with varying thicknesses around the arc, etc. By positioning one or more magnetic plug shims 906 within flux dam 902 while measuring the B-field within aperture 724, real-time mechanical adjustment of the ExB mass filter may be effected to optimize the B-field distribution near entrance end ring 730 and within aperture 724. FIG. 3B is a schematic side cross-section D-D 950 of entrance end cap 722 and entrance ring 730 with aperture 724 of an ExB mass filter with a preferred embodiment of the present invention.

Figure 10:
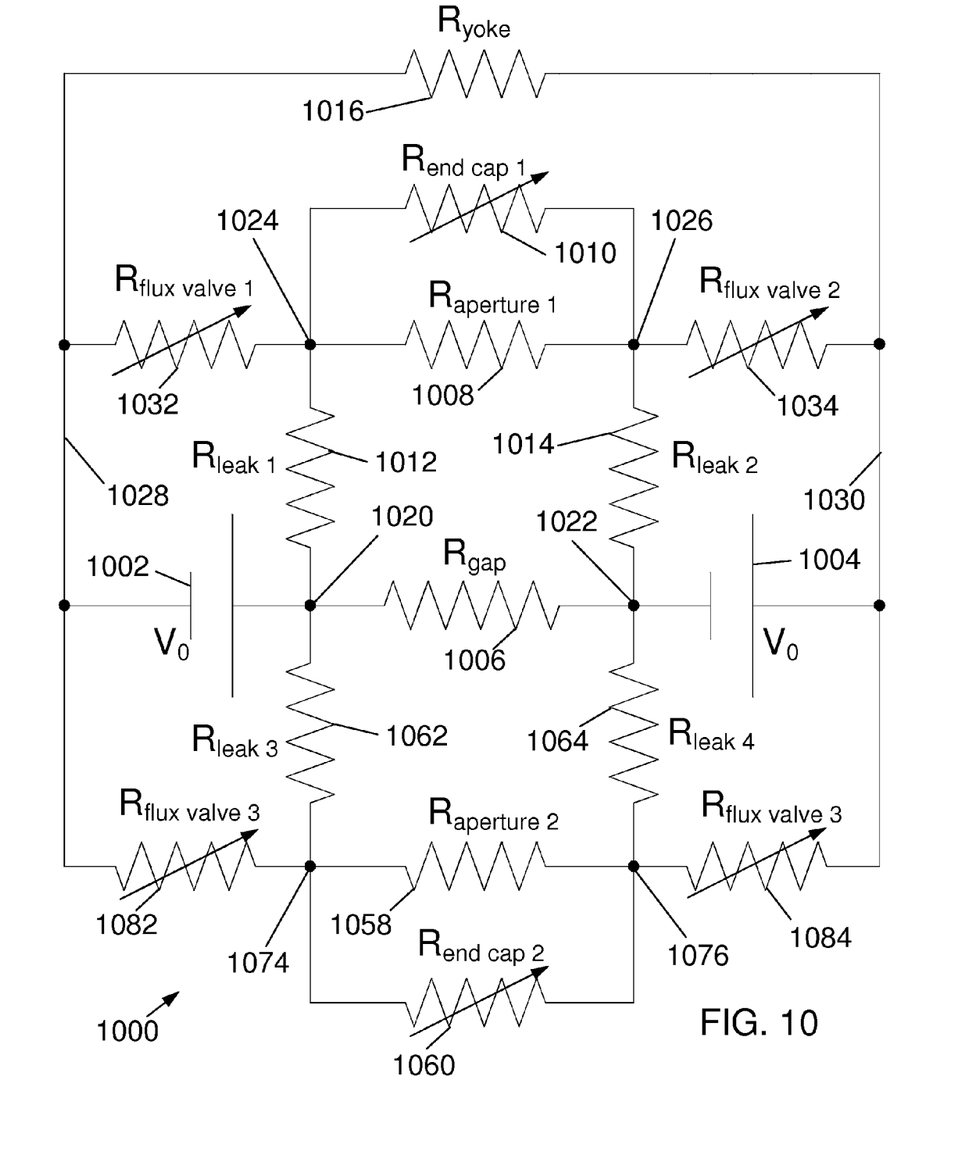
FIG. 10 is an electrical circuit analog to the magnetic circuit illustrated in FIG. 8.

FIG. 10 is an electrical circuit analog 1000 to the magnetic circuit illustrated in FIG. 8. In this schematic diagram, as in FIG. 4, the resistors are labeled with their respective correspondences to the reluctances of various elements of the ExB mass filter in FIGS. 7 and 8. Batteries 1002 and 1004 have voltages $V_0$ representing the remanence of the two magnets 706. $R_{gap}$ 1006 represents the reluctance of the gap between pole pieces 702, corresponding to the physical aperture of the ExB through which the ions pass. $R_{yoke}$ 1016 represents the reluctance of the yoke 708 which conveys the majority of the flux induced by magnets 706 from the right side of the right magnet 706 around to the left side of the left magnet 706 in FIG. 8. $R_{flux\ valve\ 1}$ 1032 and $R_{flux\ valve\ 2}$ 1034 correspond to the (adjustable) reluctances across the two flux valves comprising the left and right sides of radial slot 750 in thickened outer ring 792, and optionally containing magnetic shims 790. Similarly, $R_{flux\ valve\ 3}$ 1082 and $R_{flux\ valve\ 4}$ 1084 correspond to the (adjustable) reluctances across the two flux valves comprising the left and right sides of radial slot 756 in thickened outer ring 794, and optionally containing magnetic shims 796. $R_{aperture\ 1}$ 1008 and $R_{end\ cap\ 1}$ 1010 are in parallel, representing the reluctances across entrance aperture 724 and around aperture 724 (within entrance end cap 722 and entrance ring 730), respectively. $R_{aperture\ 2}$ 1058 and $R_{end\ cap\ 2}$ 1060 are in parallel, representing the reluctances across exit aperture 728 and around aperture 728 (within exit end cap 726 and exit ring 732), respectively. Finally, the four resistors $R_{leak\ 1}$ 1012, $R_{leak\ 2}$ 1014, $R_{leak\ 3}$ 1062, and $R_{leak\ 4}$ 1064 represent the reluctances between the edges of the pole pieces 702 and the inner surfaces of the two end caps 722 and 726. Eight voltage nodes 1020, 1022, 1024, 1026, 1028, 1030, 1074, and 1076 are illustrated in FIG. 8, where, for example, the voltage at a node 1020 is notated $V_{1020}$, etc.

The calculations for FIG. 4 apply to FIG. 10 as well, with the obvious number substitutions corresponding to the reluctances and magnets in FIG. 10. One difference between FIGS. 4 and 10 is that the four fixed spacer reluctances $R_{spacer\ 1}$, $R_{spacer\ 2}$, $R_{spacer\ 3}$, and $R_{spacer\ 4}$, are replaced by four mechanically-adjustable flux valve reluctances $R_{flux\ valve\ 1}$, $R_{flux\ valve\ 2}$, $R_{flux\ valve\ 3}$, and $R_{flux\ valve\ 4}$ and also the fixed end cap reluctances $R_{end\ cap\ 1}$ and $R_{end\ cap\ 2}$ are replaced by variable end cap reluctances. Adjustment of the entrance flux valve reluctances is effected by inserting/removing magnetic shims 790 into/from radial slot 750, or by inserting magnetic shims 790 with different permeabilities into radial slot 750. Adjustment of the end cap reluctances is effected by inserting/removing magnetic plug shims 90 into/from flux dam 902, or by inserting magnetic plug shims 906 with different permeabilities into flux dam 902.

The conclusions from FIG. 4 apply also to FIG. 10, in particular, equations 18 and 19, which may be reformulated with $R_{flux\ valve}$ substituted for $R_{spacer}$:

$$V_A/V_C = R_{gap}/R_{yoke} = R_{leak}/R_{flux\ valve}, \qquad [\text{eq. 23}]$$

$$R_{flux\ valve} = (R_{leak} R_{yoke})/R_{gap}. \qquad [\text{eq. 24}]$$

Note that in equation 23, the ratio of $R_{leak}$ to $R_{flux\ valve}$ is all that matters for ExB field matching, not the values of the individual reluctances. Thus a closer end cap-to-pole piece spacing (making $R_{leak}$ smaller) is feasible as long as $R_{flux\ valve}$ is made correspondingly smaller (by adjusting or adding more shims 790 and 796). Closer end cap-to pole piece spacing enables the reduction of the overall length of an ExB filter according to a preferred embodiment of the invention.

For the case of an ExB mass filter with a preferred embodiment of the present invention having asymmetric entrance and exit geometries (spacer and end cap designs), the following equations hold:

$$R_{gap}/R_{yoke} = R_{leak1}/R_{fluxvalve1} \qquad [\text{eq. 25}]$$
$$= R_{leak2}/R_{fluxvalve2}$$
$$= R_{leak3}/R_{fluxvalve3}$$
$$= R_{leak4}/R_{fluxvalve4}.$$

Figure 11:
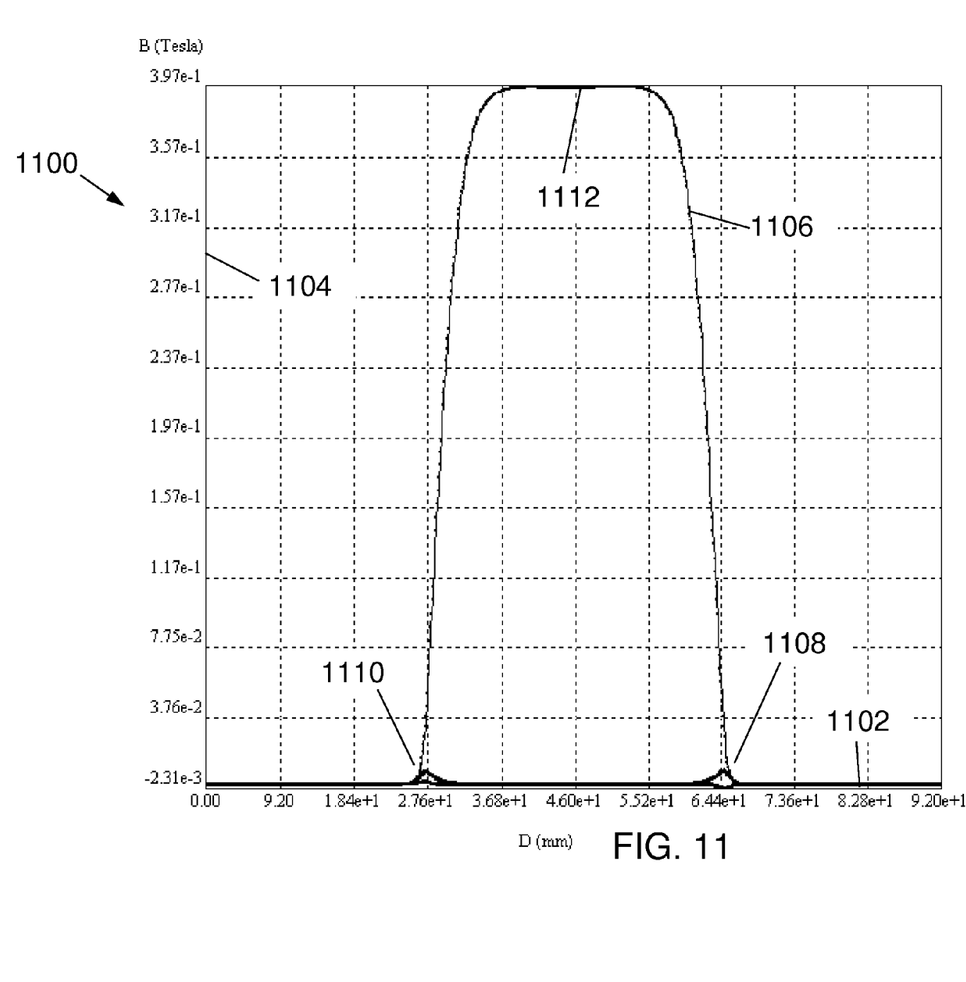
FIG. 11 is a calculated graph of the axial B-field distribution for a mass filter according to a preferred embodiment of the present invention.

FIG. 11 is a calculated graph 1100 of the axial B-field distribution 1106 for a preferred embodiment of the present invention. The B-field 1104 in the transverse (X-axis) direction is plotted against the axial position 1102 along the Z-axis (the ion beams travel in the +Z-direction). At the entrance to the mass filter the B-field 1110 smoothly drops to 0 Tesla from a peak value 1112, with no negative dip 510 as in FIG. 5 and also with no secondary peak 610 as in FIG. 6. Similarly, at the exit to the mass filter the B-field 1108 smoothly drops to 0 Tesla, with no negative dip 508 as in FIG. 5 and also with no secondary peak 608 as in FIG. 6. Thus graph 1100 illustrates the effectiveness of preferred embodiments of the present invention for adjusting the entrance and exit B-fields to more closely match the E-fields, thereby meeting the field-matching criterion for optimal ExB operation.

The invention described herein has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for use with the present invention are commercially available, for example, from FEI Company, the assignee of the present application.

Further, it should be recognized that embodiments of the present invention can be implemented or controlled via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Also, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

As used herein, the terms "B-field" and "magnetic field" are used interchangeably. The term "FIB" or "focused ion beam" is used herein to refer to any collimated ion beam, including a beam focused by ion optics and shaped ion beams. Also, any discussion of the magnetic fields "within an end cap," "near an end cap," or "near an aperture" will be understood to include the area between the end cap inner surfaces and the edges of the pole pieces and within the entrance and exit apertures.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam mass filter, comprising:
   a set of electrodes for providing an electric field within the mass filter;
   a set of magnets for providing a magnetic flux within the mass filter, the flux being perpendicular to the electric field;
   a yoke supporting the electrodes and magnets, the yoke providing a return path for the magnetic flux;
   an entrance end cap including an entrance aperture for the beam to enter the mass filter, and a mechanically adjustable reluctance between the entrance end cap and the yoke; and
   an exit end cap including an exit aperture for the beam to exit the mass filter, and a mechanically adjustable reluctance between the exit end cap and the yoke.

2. The charged particle beam mass filter of claim 1 in which the reluctance between the entrance end cap and the yoke is adjusted using magnetic shims, and in which the reluctance between the exit end cap and the yoke is adjusted using magnetic shims.

3. The charged particle beam mass filter of claim 2 in which the magnetic shims are configured to substantially reduce the magnetic fields within the entrance and exit apertures.

4. The charged particle beam mass filter of claim 2 in which the magnetic shims are configured to change the direction of the magnetic field within the entrance and/or exit apertures.

5. The charged particle beam mass filter of claim 2 in which the magnetic shims are configured to reduce the magnetic fields within the entrance and exit apertures to a magnitude of less than one percent of the maximum magnetic flux within the mass filter.

6. The charged particle beam mass filter of claim 1, further comprising:
   an entrance flux dam surrounding the entrance aperture;
   a plurality of magnetic plug shims configured within the entrance flux dam to adjust the magnetic field orientation and magnitude within the entrance aperture;
   an exit flux dam surrounding the exit aperture; and
   a plurality of magnetic plug shims configured within the exit flux dam to adjust the magnetic field orientation and magnitude within the exit aperture.

7. The charged particle beam mass filter of claim 6 in which the magnetic field magnitude within the entrance and exit apertures is adjusted to a magnitude of less than one percent of the maximum magnetic flux within the mass filter.

8. The charged particle beam mass filter of claim 6 in which the magnetic shims and the magnetic plug shims can be used to equalize the opposing electric and magnetic forces throughout the length of the ExB filter.

9. The charged particle beam mass filter of claim 6 in which adjusting the magnetic fields within the mass filter can be accomplished without changing the materials from which any of the components of the mass filter are formed.

10. The charged particle beam mass filter of claim 1 wherein the set of magnets comprises a set of permanent magnets.

11. The charged particle beam mass filter of claim 1 wherein the set of magnets comprises a set of electromagnets.

12. A charged particle beam mass filter, comprising:
   a set of electrodes for providing an electric field within the mass filter;
   a set of magnets for providing a magnetic flux within the mass filter, the flux being perpendicular to the electric field;
   a yoke supporting the electrodes and magnets, the yoke providing a return path for the magnetic flux;
   an entrance end cap including an entrance aperture for the beam to enter the mass filter, a first groove in the outer edge of the entrance end cap, and a plurality of magnetic shims configured within the first groove to adjust the reluctance between the entrance end cap and the yoke; and
   an exit end cap including an exit aperture for the beam to exit the mass filter, a second groove in the outer edge of the exit end cap, and a plurality of magnetic shims configured within the second groove to adjust the reluctance between the exit end cap and the yoke.

13. The charged particle beam mass filter of claim 12 in which the magnetic shims are configured to substantially reduce the magnetic fields within the entrance and exit aperture.

14. The charged particle beam mass filter of claim 12 in which the magnetic shims are configured to reduce the magnetic fields within the entrance and exit apertures to a magnitude of less than one percent of the maximum magnetic flux within the mass filter.

15. A charged particle beam mass filter as in claim 12, further comprising:
   an entrance flux dam surrounding the entrance aperture;
   a plurality of magnetic plug shims configured within the entrance flux dam to adjust the magnetic field orientation and magnitude within the entrance aperture;
   a exit flux dam surrounding the exit aperture; and
   a plurality of magnetic plug shims configured within the exit flux dam to adjust the magnetic field orientation and magnitude within the exit aperture.

16. The charged particle beam mass filter of claim 15 in which the magnetic field magnitude within the entrance and exit apertures is adjusted to a magnitude of less than one percent of the maximum magnetic flux within the mass filter.

17. The charged particle beam mass filter of claim 15 in which the magnetic shims and the magnetic plug shims can be used to equalize the opposing electric and magnetic forces throughout the length of the ExB filter.

18. The charged particle beam mass filter of claim 15 in which adjusting the magnetic fields within the mass filter can be accomplished without changing the materials from which any of the components of the mass filter are formed.

19. The charged particle beam mass filter of claim 1 in which the mechanically adjustable reluctance between the entrance end cap and the yoke and the mechanically adjustable reluctance between the exit end cap and the yoke provide reluctance between the entrance end cap and the yoke and between the exit end cap and the yoke.

\* \* \* \* \*